United States Patent
Tsai et al.

(10) Patent No.: US 6,410,417 B1
(45) Date of Patent: Jun. 25, 2002

(54) METHOD OF FORMING TUNGSTEN INTERCONNECT AND VIAS WITHOUT TUNGSTEN LOSS DURING WET STRIPPING OF PHOTORESIST POLYMER

(75) Inventors: Nien-Yu Tsai, Taipei; Hong-Long Chang; Chun-Wei Chen, both of Hsin-Chu; Ming-Li Kung, Chi-Lung, all of (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 09/186,757

(22) Filed: Nov. 5, 1998

(51) Int. Cl.[7] .................. H01L 21/4763; H01L 21/461; H01L 21/3065; H01L 21/47
(52) U.S. Cl. .................. 438/618; 438/725; 430/329; 216/67
(58) Field of Search ................. 438/669, 688, 438/720, 725, 618; 156/643.1, 646.1, 345, 643, 646, 664; 134/1; 216/67; 430/329

(56) References Cited

U.S. PATENT DOCUMENTS

| | | | | |
|---|---|---|---|---|
| 4,983,254 A | * | 1/1991 | Fujimura et al. | 156/643 |
| 5,057,187 A | * | 10/1991 | Shinagawa et al. | 156/643 |
| 5,117,276 A | * | 5/1992 | Thomas et al. | 357/71 |
| 5,380,397 A | * | 1/1995 | Fukuyama | 156/643 |
| 5,397,432 A | * | 3/1995 | Konno et al. | 156/665 |
| 5,414,221 A | * | 5/1995 | Gardener | 174/261 |
| 5,560,803 A | * | 10/1996 | Mihara et al. | 156/643.1 |
| 5,773,201 A | * | 6/1998 | Fujimura et al. | 430/329 |
| 5,776,832 A | * | 7/1998 | Hsieh et al. | 438/669 |
| 5,946,589 A | * | 8/1999 | Ng et al. | 438/586 |

OTHER PUBLICATIONS

Bothra, S. et al., "A New Failure Mechanism by Corrosion of Tungsten in a Tungsten Plug Process," *IEEE Intl. Reliability Physics Symp.*, pp. 150–156, 1998..

\* cited by examiner

*Primary Examiner*—Mary Wilczewski
(74) *Attorney, Agent, or Firm*—Blakely Sokoloff Taylor & Zafman, LLP

(57) ABSTRACT

A method of forming a metal interconnect structure and via plugs over a dielectric layer having a plurality of vias formed therein is disclosed. The method comprises the steps of: forming tungsten via plugs in the plurality of vias; depositing a metal layer over the dielectric layer and the plurality of tungsten via plugs; patterning and etching the metal layer using a photoresist layer to form the metal interconnect structure; removing the photoresist layer in an asher using a combination of oxygen plasma and water vapor, the ratio of oxygen plasma and water vapor being less than one; and performing a wet strip on the metal interconnect structure.

3 Claims, 2 Drawing Sheets

METHOD OF FORMING TUNGSTEN INTERCONNECT AND VIAS WITHOUT TUNGSTEN LOSS DURING WET STRIPPING OF PHOTORESIST POLYMER

FIELD OF THE INVENTION

The present invention relates to an improved method of metal interconnect etching, and more particularly, to a method of reducing tungsten loss due to wet stripping after metal interconnect etching.

BACKGROUND OF THE INVENTION

The process of forming a metal interconnect layer and the associated conductive via plugs that connect different interconnect layers is an important process in the manufacture of integrated circuits. In this process, via plugs are first formed in the vias formed in an underlying dielectric layer. The dielectric layer is typically an oxide and includes multiple vias that extend from the top of the insulative dielectric layer down to an underlying metal interconnect, landing pad, contact pad, or semiconductor substrate. Typically, the via plugs are formed by depositing a tungsten layer using a chemical vapor deposition process or physical vapor deposition sputtering process. Then, either a metal chemical mechanical polishing (CMP) or an etch back technique is used to remove the tungsten lying outside the vias.

Next, a second metal layer, such as aluminum, is blanket deposited over the dielectric layer and over the via plugs. Once the second metal layer has been blanket deposited over the oxide, a photoresist layer is deposited, patterned, and developed over the second metal layer. The photoresist layer is patterned to reflect the desired metal interconnect pattern. Next, using a plasma etching technique, the metal layer is etched using the patterned photoresist layer as a mask. After the etching of the second metal layer is complete, the photoresist is removed. Although not particularly relevant to the present invention, in manufacturing practice, a thin titanium/titanium nitride layer is typically deposited to act as an adhesion layer between the oxide and the metal layers.

One common method of removing the photoresist is by "ashing." The ashing is performed in a plasma asher, typically by using an oxygen plasma. However, it has been found that the ashing process often times leaves a polymer residue on the surface of the wafer. Additionally, another side effect of the ashing process by oxygen plasma is an increase in the charge on the wafer. The charge will be typically stored in floating lines.

In order to remove the polymer residue, a wet stripper is used. However, it has been found that the wet stripper, especially when the wet stripper is an alkaline solvent, reacts with the tungsten plugs in the vias. The reaction causes erosion of the tungsten as well as increasing the contact resistance of the tungsten. This phenomena is described in "A New Failure Mechanism by Corrosion of Tungsten in a Tungsten Plug Process" by S. Bothra et al., Technology Department, VLSI Technology Inc. (1998). It can be appreciated that the tungsten in the vias is exposed because of imperfect overlay of the metal interconnect pattern over the vias or design requirements.

Therefore, what is needed is a method of effectively forming a tungsten metal interconnect while protecting the tungsten plugs in the vias from erosion.

SUMMARY OF THE INVENTION

A method of forming a metal interconnect structure and via plugs over a dielectric layer having a plurality of vias formed therein is disclosed. The method comprises the steps of: forming tungsten via plugs in said plurality of vias; depositing a metal layer over said dielectric layer and said plurality of tungsten via plugs; patterning and etching said metal layer using a photoresist layer to form said metal interconnect structure; removing said photoresist layer in an asher using a combination of oxygen plasma and water vapor, said ratio of oxygen plasma and water vapor being less than one; and performing a wet strip on said metal interconnect structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
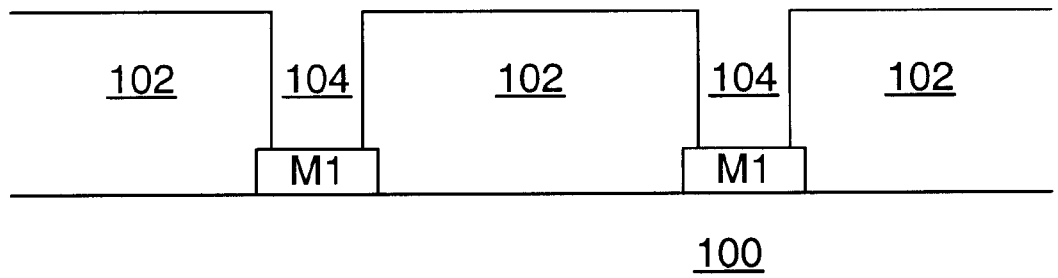
FIGS. 1–4 illustrate in cross section the steps in forming a tungsten metal interconnect in accordance with the present invention.

Turning to FIG. 1, a substrate 100 is shown having placed thereon metal lines M1. The metal lines M1 on the substrate 100 are merely exemplary of the types of underlying semiconductor structures to which an overlying metal interconnect layer may be connected. Thus, the term substrate is meant to include underlying semiconductor devices formed on or in a semiconductor substrate or intermediate level devices.

The metal lines M1 illustrate an exemplary first level of metal interconnect. Above the substrate 100 and the metal lines M1 is a dielectric layer 102. Typically, the dielectric layer 102 is an oxide such as borophosphosilicate glass (BPSG), silicon dioxide, spin on glass (SOG), or any combination of the above and other types of dielectric nitrides or oxides.

Formed within the dielectric layer 102 are vias 104. The vias 104 extend from the top of the dielectric layer 102 down to the metal lines M1. These vias are used as conductive pathways between two layers of metal interconnects. The vias are formed using conventional photolithography and etching. In this particular embodiment, the vias 104 are located above the metal lines M1. However, it can be appreciated that other vias may also extend down to the substrate 100.

Figure 2:
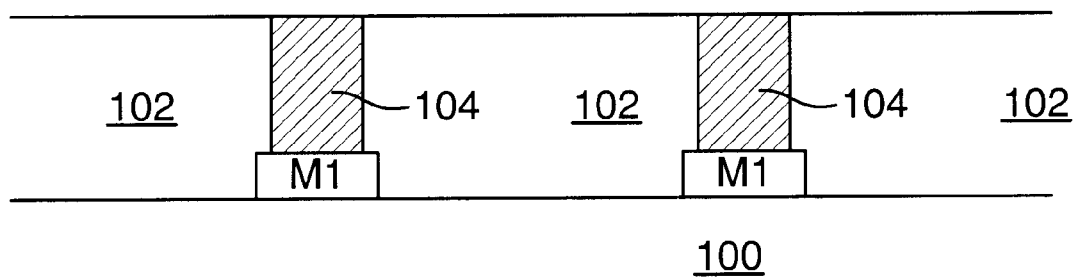

Next, turning to FIG. 2, conductive via plugs 106 are formed in the vias 104. Typically, the via plugs 106 are formed by depositing a tungsten layer using a chemical vapor deposition process or physical vapor deposition sputtering process. Then, either a metal chemical mechanical polishing (CMP) or an etch back technique is used to remove the tungsten lying outside the vias.

Figure 3:
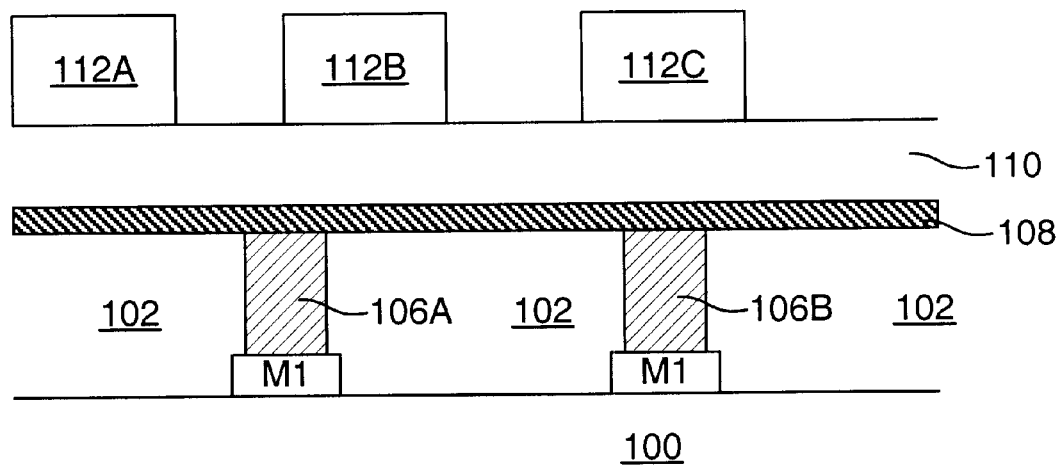

Next, turning to FIG. 3, a thin titanium/titanium nitride layer 108 is formed over the dielectric layer 102 and the via plugs 106. Then, a metal layer 110 is deposited over the Ti/TiN layer 108. Typically, the metal layer 110 is formed from aluminum to a thickness of 5000 angstroms.

Next, a photoresist layer 112 is deposited onto the aluminum layer 110. The photoresist layer 112 is then exposed and developed in accordance with a predetermined pattern that corresponds to the desired pattern of the metal interconnect structure to be formed. An exemplary pattern is shown in FIG. 3. As seen in FIG. 3, portions of the photoresist layer 112 remain to protect those areas of the metal layer 110 that are to remain after etching.

However, as seen in FIG. 3, one of the photoresist blocks 112b is misaligned to one of the via plugs 106a. This misalignment is due to difficulty in aligning a later photoresist mask pattern directly over via plugs. This problem becomes more difficult as critical dimensions become smaller and smaller.

Figure 4:
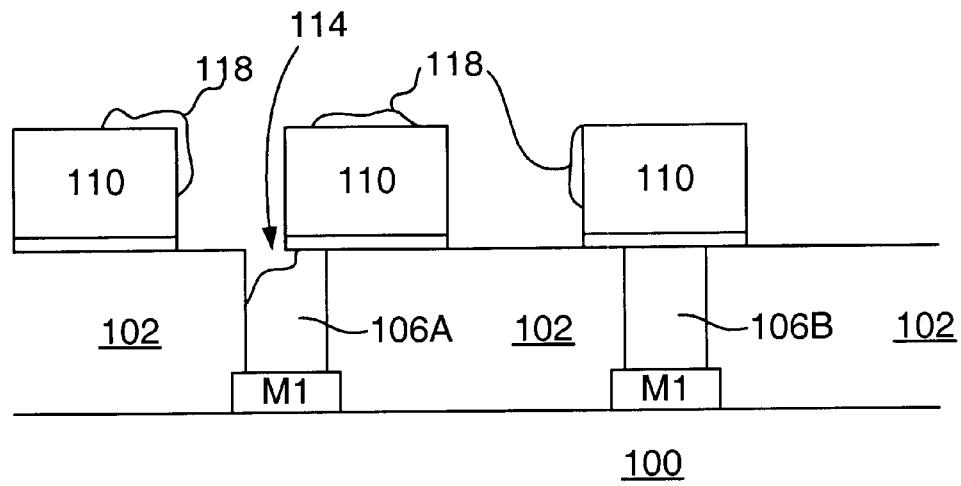

The resulting structure after etching is shown in FIG. 4. Because of the misalignment, a portion 114 of the via plug 106a is exposed. This exposed tungsten 114 is susceptible to erosion as will be seen below.

After the aluminum layer 110 has been etched, the remaining photoresist blocks 112 are removed. Preferably, the photoresist blocks 112 are removed in an asher. It has been determined by the inventors that by eliminating the use of oxygen plasma or using a low oxygen flow plasma mixed with other gases like water plasma, the amount of wafer charging can be reduced and the tungsten may be protected from erosion.

Specifically, using a TCP 9600 metal etcher with an in-situ DSQ asher, the preferred recipe is 1000 mT of pressure, 1000 watts power, 50 sccm of oxygen, 400 sccm of water vapor, at 225 degrees Celsius, for 120 seconds. Although the ratio of oxygen to water vapor may vary, it has been determined that the ratio of oxygen to water vapor should not exceed 1:1.

Alternatively, it has also been found that ashing with an oxygen plasma followed by an ashing with water vapor can reduce wafer charging. Specifically, using a TCP 9600 metal etcher with an in-situ DSQ asher, the preferred recipe uses a conventional oxygen ashing followed by pure water vapor plasma ashing at a flow rate of between 300–500 sccm for 20–30 seconds.

One beneficial result from the process described above is that the wafer is only minimally charged. As will be seen below, this helps to reduce the amount of tungsten erosion during the later step of wet stripping.

Although effective to remove most of the photoresist, the ashing process does not remove the polymer 118 that adheres to the aluminum 110. The polymer 118 is formed during the etching of the aluminum layer 110.

In order to remove the polymer 118, a wet stripper is used. Typically, the wet stripper is an alkaline solvent. However, it has been found that the alkaline solvent used to remove the polymers 118 reacts adversely with the aluminum 110. This is particularly damaging to the tungsten in the vias which the metal lines do not completely cover. The reaction of the alkaline solvent to the tungsten is amplified by the charging on the wafers due to the prior art oxygen plasma ashing. As noted above, with the ashing process of the present invention, the amount of wafer charging is significantly reduced. This results in a lower erosion rate of the tungsten and less contact resistance in the tungsten layer.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a metal interconnect structure and via plugs over a dielectric layer having a plurality of vias formed therein, the method comprising the steps of:

forming tungsten via plugs in said plurality of vias;

depositing a metal layer over said dielectric layer and said plurality of tungsten via plugs;

patterning and etching said metal layer using a photoresist layer to form said metal interconnect structure;

removing said photoresist layer in an asher using a combination of oxygen plasma and water vapor, said ratio of oxygen plasma and water vapor being less than one; and performing a wet strip on said metal interconnect structure.

2. The method of claim 1 wherein said asher performs an ashing process with a gas mixture of 50 sccm of oxygen and 400 sccm of water vapor.

3. The method of claim 2 wherein said asher performs said ashing process at 1000 mT of pressure and 1000 watts power for 120 seconds.

* * * * *